United States Patent
Mahrla

(10) Patent No.: US 6,874,073 B2
(45) Date of Patent: Mar. 29, 2005

(54) METHOD FOR MANAGING DATA STORED PRIMARILY IN A READ-ONLY MEMORY

(75) Inventor: Peter Mahrla, Zorneding (DE)

(73) Assignee: Infineon Technologies AG, Munich (DE)

( * ) Notice: Subject to any disclaimer, the term of this patent is extended or adjusted under 35 U.S.C. 154(b) by 109 days.

(21) Appl. No.: 10/431,423

(22) Filed: May 7, 2003

(65) Prior Publication Data
US 2003/0196051 A1 Oct. 16, 2003

Related U.S. Application Data

(63) Continuation of application No. PCT/DE01/03891, filed on Oct. 11, 2001.

(30) Foreign Application Priority Data
Nov. 7, 2000 (DE) .......................................... 100 55 096

(51) Int. Cl.⁷ .............................................. G06F 12/02
(52) U.S. Cl. ...................................... 711/159; 711/102
(58) Field of Search ................................. 711/159, 102, 711/165

(56) References Cited

U.S. PATENT DOCUMENTS

| | | | |
|---|---|---|---|
| 4,601,031 A | 7/1986 | Walker et al. | |
| 5,724,497 A | * 3/1998 | San et al. | 345/469 |
| 5,757,690 A | 5/1998 | McMahon | |
| 5,940,850 A | 8/1999 | Harish et al. | |
| 6,101,600 A | * 8/2000 | Arnold et al. | 713/1 |
| 6,154,838 A | * 11/2000 | Le et al. | 713/2 |
| 2003/0005259 A1 | * 1/2003 | Nalawadi et al. | 712/1 |

FOREIGN PATENT DOCUMENTS

| | | |
|---|---|---|
| EP | 0 333 207 A2 | 9/1989 |
| EP | 0 419 202 A2 | 3/1991 |
| EP | 0 509 633 A2 | 10/1992 |
| JP | 06103056 | 4/1994 |

* cited by examiner

Primary Examiner—Hiep T. Nguyen
(74) Attorney, Agent, or Firm—Laurence A. Greenberg; Werner H. Stemer; Ralph E. Locher

(57) ABSTRACT

A method allows the use of inexpensive read-only memory together with rewriteable memory. To this end, a memory management logic unit interacts with a control unit, with a read-only memory and with a rewriteable memory. The data, in particular memory areas of the read-only memory, have been replaced with data in the rewriteable memory. If the control unit accesses the replaced data in the read-only memory, the memory management logic unit diverts this access to the corresponding data in the rewriteable memory.

5 Claims, 2 Drawing Sheets

METHOD FOR MANAGING DATA STORED PRIMARILY IN A READ-ONLY MEMORY

CROSS-REFERENCE TO RELATED APPLICATION

This application is a continuation of copending International Application No. PCT/DE01/03891, filed Oct. 11, 2001, which designated the United States and was not published in English.

BACKGROUND OF THE INVENTION

Field of the Invention

The invention relates generally to the field of semiconductor memories and methods for managing them. In this context, the invention relates particularly to a memory management logic unit for extended use of read-only memories.

At present, programs are stored in microprocessor systems using, besides non-rewriteable read-only memories (ROMs), also rewriteable memories, such as RAMs or flash memories. In comparison with rewriteable memories, read-only memories can be produced inexpensively and, on account of easily implemented monolithic integration, afford faster access times and hence increased working speeds in the microprocessor systems. Since read-only memories are generally programmed using a mask for reasons of cost, it is not possible to alter their content again after manufacture. To be able to modify the stored data again after the memory has been manufactured too, rewriteable memories are also used instead of the read-only memories. These have the drawbacks over read-only memories described above, however.

SUMMARY OF THE INVENTION

It is accordingly an object of the invention to provide a method for managing data stored primarily in a read-only memory that overcomes the hereinafore-mentioned disadvantages of the heretofore-known methods of this general type and that extends the opportunities for use of read-only memories. In particular, the intention is to provide memory systems that have the advantages of read-only memories and nevertheless have the option of being rewriteable.

With the foregoing and other objects in view, there is provided, in accordance with the invention, a method for managing data stored primarily in a read-only memory. The first step of the method is providing a read-only memory for storing data. The read-only memory has a memory area. The next step is providing a rewritable memory having two memory areas. A first of the memory areas of the rewritable memory stores data that replaces the data stored in the memory area of the read-only memory. The next step is diverting access from the data stored in the replaced memory area of the read-only memory to the data stored in the memory area of the rewriteable memory. The next step ("the forwarding step") is forwarding a current access operation to data to a memory used for a previous access operation. The next step is if, between the current access operation and the previous access operation, a change between the read-only memory and the rewriteable memory or a change between the two areas of the rewriteable memory is necessary, not using the stored data returned by the memory addressed in the forwarding step, and again forwarding the current access to a correct memory. The next step is if, between the current access operation and the previous access operation, no change between the read-only memory and the rewriteable memory and between two areas of the rewriteable memory is necessary, using the data item returned by the memory addressed in the forwarding step.

A fundamental concept of the invention is to allow access by a control unit to stored data which are stored primarily in a read-only memory, and equally also to data which have been altered as compared with the data stored in the read-only memory. These altered data are stored in a rewriteable memory. This can be implemented using a memory management logic unit that interacts with a control unit, with the read-only memory and with the rewriteable memory and diverts access by the control unit to prescribed addresses in the read-only memory to the rewriteable memory. The data in the read-only memory that have been replaced with data in the rewriteable memory are therefore characterized by the prescribed addresses. The corresponding data in the rewriteable memory have associated addresses. If the control unit accesses the prescribed addresses in the read-only memory, the memory management logic unit diverts this access to the associated addresses in the rewriteable memory. Otherwise, the read-only memory is accessed.

This invention increases the flexibility of a read-only memory, since the data stored in the read-only memory can still be modified even after the read-only memory has been manufactured. Since normally only a small portion of the stored data in the read-only memory needs to be replaced with modified data, the rewriteable memory can have a correspondingly lower storage capacity than the read-only memory. This makes this solution much less expensive as compared with full replacement of the read-only memory with a rewriteable memory. In addition, the comparatively small portion of data in the rewriteable memory also means that the control unit's speed of access to the stored data is not slowed down by much. The inventive measure therefore provides a novel way of combining the advantages of a read-only memory with the opportunity to be able to modify the data stored in the memory.

Preferably, for the purpose described above, the memory management logic unit has access to an association table which associates the prescribed addresses in the read-only memory with the associated addresses in the rewriteable memory.

In line with one preferred embodiment of the invention, the association table is stored in the rewriteable memory. The advantage of this measure is that the association table can likewise be modified. Thus, if required, other memory areas of the read-only memory can be replaced with memory areas of the rewriteable memory. This measure provides the memory system with even greater flexibility.

Advantageously, the association table can be transferred from the rewriteable memory to the memory management logic unit. By way of example, the association table can be copied to a set of registers in the memory management logic unit before a program starts to be executed. This makes the association table available at a high access speed, and an increased time for accessing the memory is avoided.

One preferred measure of the invention is characterized in that the addresses in the read-only memory and in the rewriteable memory are in binary-coded form. This facilitates access to the data. In addition, the areas of the read-only memory which contain the stored data with the prescribed addresses and also the areas of the rewriteable memory can then preferably be chosen such that their sizes correspond to an integer power of the number two. This measure is used both for quickly finding the replaced memory areas of the read only memory and for configuring the memory areas in the rewriteable memory in a space-saving manner.

Another embodiment of the invention is characterized in that the memory management logic unit contains binary comparators. This measure allows the memory management logic unit to be in the form of an associative memory. The task of the binary comparators in this context is to compare the addresses accessed by the control unit with the prescribed addresses in the read-only memory. In addition, provision can be made for the memory management logic unit to contain binary comparators which are configured such that, upon access by the control unit to prescribed addresses in the read-only memory, they replace the prescribed addresses for the access with the associated addresses in the rewriteable memory. This therefore diverts the access to the rewriteable memory. Each of the binary comparators is expediently configured such that the number of address bits for which it is performing a comparison can be matched to the size of the memory area.

One particularly preferred embodiment of the invention is characterized in that the memory management logic unit is incorporated in a memory management system which also contains a control unit, a read-only memory and a rewriteable memory. By way of example, the control unit can be a microprocessor. This can preferably be monolithically integrated together with the other components of the memory management system on a common substrate. Such a monolithically integrated system is distinguished by high data processing speeds and low manufacturing costs for large quantities.

In addition, the memory management system just described can, in one preferred embodiment of the invention, be connected to an external, nonvolatile rewriteable memory via a data interface. This memory contains, by way of example, the modified content of the replaced areas of the read-only memory and, by way of example, also the association table. Before the start of program execution, this memory content is loaded into the internal, rewriteable memory in the memory management system, which can be a volatile, rewriteable memory, for example. This measure makes the content of the external memory available to the memory management system at a high access speed. If, on the other hand, the external, nonvolatile rewriteable memory were to act as the rewriteable memory in the memory management system, a large number of address and data pins would be required in order to attain the same access speed as in the case of the preferred embodiment described above. The contrastingly smaller number of address and data pins drastically reduces the costs for manufacturing the monolithic chip in the case of the preferred embodiment. In addition, this reduces the wiring on the terminal's board to a considerable extent and thus also achieves a smaller physical size for the terminal.

The inventive method for managing stored data, where stored data are stored primarily in a read-only memory, is characterized by the following steps:

if required, a memory area intended to replace a memory area of the read-only memory is produced in a rewriteable memory access to stored data in the replaced memory area involves a diversion being made to the corresponding memory area of the rewriteable memory.

In line with this method, the stored data are generally held in a read-only memory and can be requested therefrom with only a small time involvement. However, the data stored in the read-only memory cannot be overwritten directly. If it is necessary to modify the data stored therein, however, a memory area is created in a rewriteable memory and the data that need to replace the data in particular memory areas of the read-only memory are stored in the rewriteable memory. If replaced areas of the read-only memory are accessed, this access is diverted to the corresponding area of the rewriteable memory. The inventive method therefore allows stored data to be managed flexibly, so that the data stored in the read-only memory are rendered modifiable to a certain degree. The just occasionally required diversion of access means that this is associated only with small losses in the access time.

In one preferred embodiment of the inventive method, the stored data are accessed by a control unit. This can be a microprocessor, for example.

One particularly preferred embodiment is characterized in that the addresses in the read-only memory and in the rewriteable memory are in binary-coded form. In addition, in the case of this particularly preferred embodiment, access by the control unit to addresses in the read-only memory which are situated in a replaced area involves only the bits of the addresses which are the same for all the addresses in this replaced area being replaced with the bits of the addresses in the corresponding area in the rewriteable memory. An advantage of this method is that only as many of the bits which are at the start of the addresses need to be read as are required before the bits which are the same for all the addresses in the replaced area are reached. This measure minimizes the time needed for aligning the addresses accessed with the addresses in the replaced memory areas. Another advantage of this particularly preferred embodiment is that, when diverting the access to the rewriteable memory, only the front bits of the original addresses need to be replaced with the bits of the addresses in the rewriteable memory. Preferably, this particularly preferred embodiment can be implemented by binary comparators. These compare the addresses accessed with the addresses in the replaced memory areas of the read-only memory, and replace the addresses, if required, with the addresses in the corresponding area of the rewriteable memory.

Another embodiment of the inventive method provides for access by the control unit first to be forwarded to the memory used for the previous access. If this access was effected in the rewriteable memory, the bits that are at the start of the address for the previous access are used for the address for the new access. Only if access to the memory twice in succession necessitates a change between the read-only memory and the rewriteable memory or between two different areas of the rewriteable memory is the data item which has been returned by the memory not forwarded to the control unit. This is the only situation in which memory access is slowed down, since the correct memory needs to be accessed again. In relation to the total number of memory access operations, the number of changes is generally negligible, however, which means that this increases the average access time only slightly.

By way of example, the forwarding of data to the control unit can be controlled by using the READY and WAIT signal. This signal, which most microprocessors have available, indicates to the microprocessor whether a valid data item is already available on the data lines. In the event of erroneous initial access to the memory, the data item is disabled for the microprocessor. Only after the second, correct access is the data item enabled for the microprocessor to read.

Other features that are considered as characteristic for the invention are set forth in the appended claims.

Although the invention is illustrated and described herein as embodied in a method for managing data stored primarily in a read-only memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
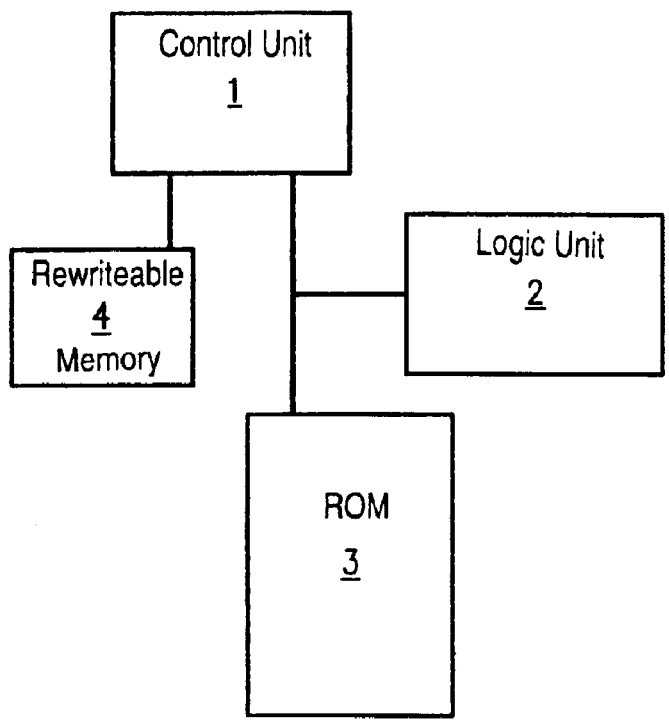
FIG. 1 is a block diagram showing a first embodiment of a memory management system according to the invention.

Referring now to the figures of the drawings in detail and first, particularly to FIG. 1 thereof, there is shown a first inventive embodiment of a memory management system. In this case, a control unit 1 is connected to a read-only memory 3 and to a rewriteable memory 4. In addition, a memory management logic unit 2 controls access by the control unit 1 to the data in the read-only memory 3 and also the flow of data from the read-only memory 3 to the control unit 1.

Some of the data in the read-only memory 3 have been replaced in this memory management system with data in the rewriteable memory 4. If the control unit 1 requests data having addresses that are in the read-only memory 3, the memory management logic unit 2 checks whether these addresses belong to the data which have been replaced with data in the rewriteable memory 4. If this is so, the memory management logic unit 2 blocks the flow of data from the read-only memory 3 to the control unit 1 and instead diverts access to the rewriteable memory 4. To this end, the addresses for the original access are replaced with the addresses for the corresponding area of the rewriteable memory 4.

To be able to identify which memory areas of the read-only memory 3 have been replaced with memory areas of the rewriteable memory 4, the memory management logic unit 2 has, by way of example, access to an association table that lists the association between the replaced areas of the read-only memory 3 and the corresponding areas in the rewriteable memory 4. This association table is normally stored in the rewriteable memory 4 and from there is loaded into the memory management logic unit 2 before execution of the application program. It is then available in the memory management logic unit at a high access speed.

It is also conceivable for the control unit 1 in this exemplary embodiment to be configured such that its access to stored data is always in the memory that was used for the previous access. In this case, the control unit 1 forwards the information regarding which memory and which addresses is/are being accessed to the memory management logic unit 2. The memory management logic unit 2 then aligns the addresses for the access with those in the association table. If the control unit 1 is accessing the wrong memory, the memory management logic unit 2 prevents any forwarding of data to the control unit 1 until the correct memory has been accessed. Such erroneous initial access is the only situation in which the access time to the stored data is slowed. However, because the rewriteable memory 4 generally contains far fewer data than the read-only memory 3, the situation just described arises relatively seldom. The access time to the stored data is therefore slowed down only insignificantly on average.

In one possible embodiment of the memory management system shown in FIG. 1, the control unit 1 is a microprocessor, the read-only memory 3 is a ROM and the rewriteable memory 4 can be in the form of a RAM. In this case, the memory management logic unit 2 can either be present in a logic circuit, in particular in a hard-wired circuit, or can be implemented purely in software in the form of a computer program.

If the control unit 1 is a microprocessor, the memory management logic unit 2 can expediently use the READY and WAIT signal to disable data forwarding to the microprocessor in the event of erroneous access to the memory. Similarly, data transfer from the respective memory to the microprocessor can be enabled using the READY and WAIT signal in the event of valid access.

Figure 2:
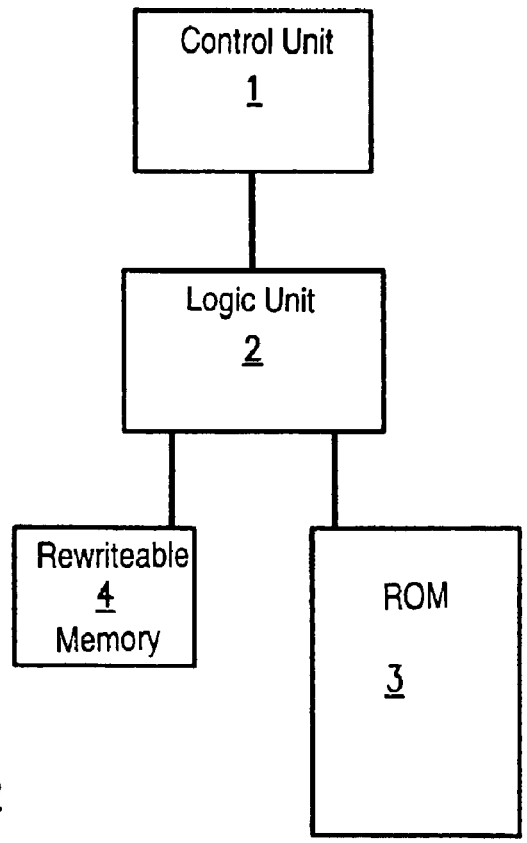
FIG. 2 is a block diagram showing a second embodiment of the memory management system.

FIG. 2 shows the block diagram for another embodiment of a memory management system. A crucial difference between this exemplary embodiment and the exemplary embodiment shown in FIG. 1 is that, in this case, the memory management logic unit 2 is connected in series between the control unit 1 and the read-only memory 3 or the rewriteable memory 4. All access by the control unit 1 to stored data is therefore routed via the memory management logic unit 2 and is forwarded from there to one of the two memories.

In this context, provision can be made for the memory management logic unit 2 first to forward all access to stored data by the control unit 1 to the memory that was used for the previous access. If it is the wrong memory, however, the memory management logic unit 2 prevents the forwarding of data from this memory to the control unit 1 and diverts access to the correct memory. Otherwise, this exemplary embodiment can have the same features as the exemplary embodiment shown in FIG. 1.

Figure 3:
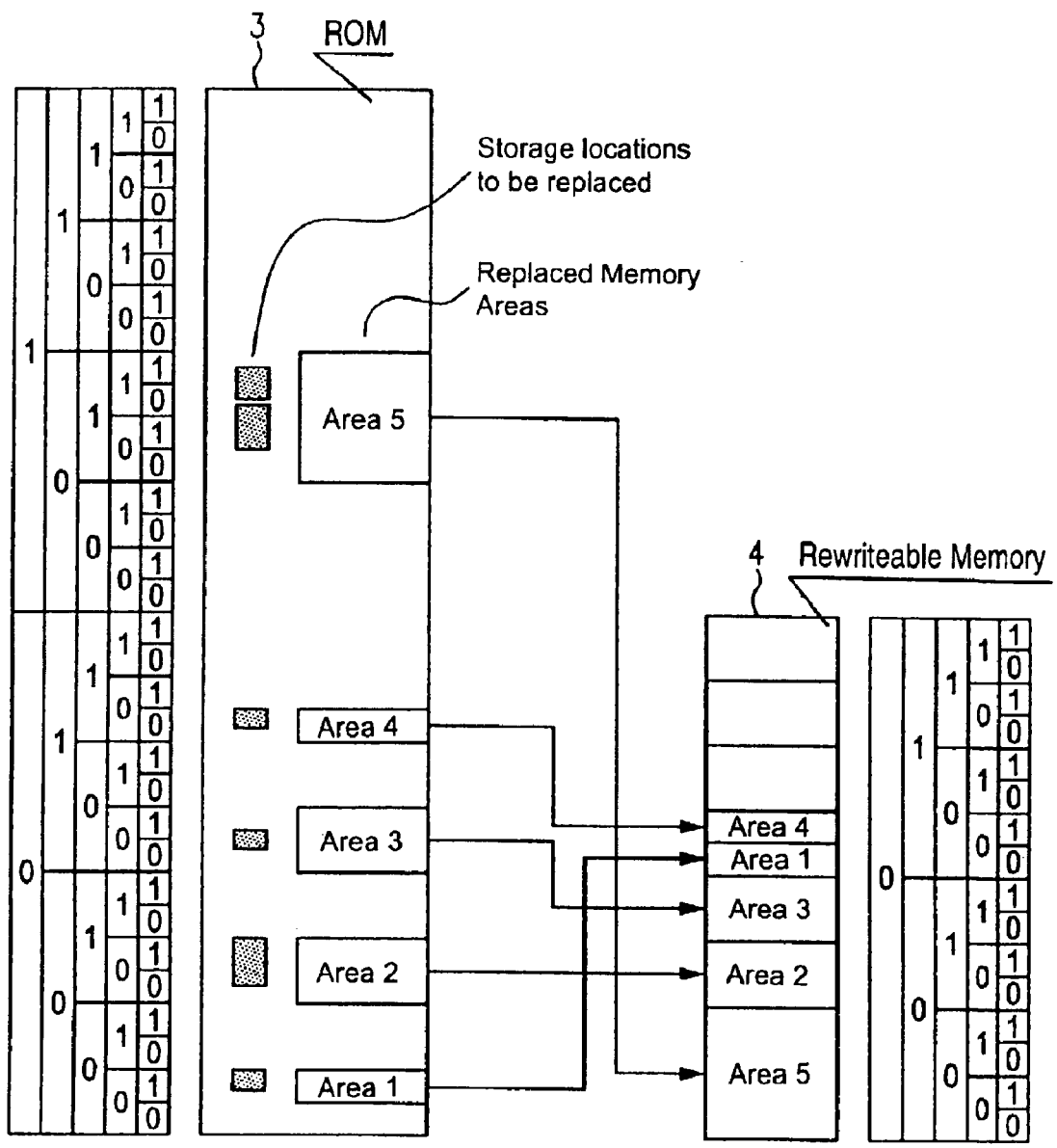
FIG. 3 is a schematic illustration of memory areas of a read-only memory and of a rewriteable memory and their association.

FIG. 3 schematically shows the memory areas of a read-only memory 3 and of a rewriteable memory 4 and the association between the replaced memory areas of the read-only memory 3 and the corresponding memory areas of the rewriteable memory 4.

Both the addresses in the read-only memory 3 and those in the rewriteable memory 4 are in binary-coded form in this exemplary embodiment. The binary coding means that the areas of the read-only memory 3 that need to be replaced with areas in the rewriteable memory 4 can be chosen such that their size corresponds to an integer power of the number two. In this case, the replaced memory areas need to be chosen such that they fully contain the respective storage locations to be replaced in the read-only memory 3. By way of example, area 5 of the read-only memory 3 will be chosen. This area contains the addresses 101xy (where x, y=0, 1). At the same time, this area—with the chosen coding—is the smallest possible unit for covering the storage locations to be replaced in this area. This practice is advantageous insofar as the replaced areas of the read-only memory 3 can be found more quickly. At the same time, it therefore also allows the memory areas to be configured in the rewriteable memory 4 in a space-saving manner.

In addition, the binary coding of the addresses in both memories affords the advantage that, upon access to replaced areas of the read-only memory 3, only the bits of the addresses that are the same for all addresses in the selected area need to be replaced with the associated bits of the addresses in the rewriteable memory 4. In the above example of area 5, the original addresses 101xy would be replaced with 000xy, i.e. the last two bits would be retained for each of the addresses, because those are the bits which are different in the addresses in the replaced area 5.

The task just described, of replacing the addresses upon access if appropriate, could be performed by binary comparators. The binary comparators would first need to compare the addresses accessed with the addresses in the replaced areas of the read-only memory 3 and would then need to replace the corresponding bits of the addresses for the access if required.

The association between the replaced areas of the read-only memory 3 and the corresponding areas of the rewriteable memory 4 is shown by arrows in FIG. 3. Preferably, this association is transferred to an association table. The association table can also be stored in the rewriteable memory 4, for example, and is loaded into the memory management logic unit 2 before the start of program execution so that it is available at a high access speed.

I claim:

1. A method for managing data stored primarily in a read-only memory, which comprises:
   (a) providing a read-only memory with a memory area for storing data;
   (b) providing a rewritable memory having first and second memory areas, the first memory area of the rewritable memory storing data replacing the data stored in the memory area of the read-only memory;
   (c) diverting access from the data stored in the replaced memory area of the read-only memory to the data stored in the memory area of the rewriteable memory;
   (d) forwarding a current access operation to data to a memory used for a previous access operation; and
   (e) if, between the current access operation and the previous access operation, at least one of a change between the read-only memory and the rewriteable memory and a change between the two areas of the rewriteable memory is necessary, not using the stored data returned by the memory addressed in step (d), and again forwarding the current access operation to a correct memory; and
   (f) if, between the current access operation and the previous access operation, no change between the read-only memory and the rewriteable memory and between two areas of the rewriteable memory is necessary, using the data item returned by the memory addressed in step (d).

2. The method according to claim 1, which further comprises accessing stored data with a control unit.

3. The method according to claim 1, which further comprises:
   identifying the memory areas of the read-only memory and the rewriteable memory with addresses in binary-coded form having bits;
   identifying same bits of the addresses shared by all the addresses in the replaced memory area; and
   accessing the data in the replaced memory area of the read-only memory by replacing only the same bits with bits of the addresses in a corresponding memory area of the rewriteable memory.

4. The method according to claim 1, which further comprises:
   accessing the stored data by comparing addresses accessed with addresses of the replaced memory areas of the read-only memory with binary comparators; and
   using the binary comparators to replace the addresses accessed with the addresses in the corresponding area of the rewriteable memory whenever required.

5. The method according to claim 2, which further comprises enabling and disabling data forwarding to the control unit using a READY and a WAIT signal.

* * * * *